(12) United States Patent
Parris et al.

(10) Patent No.: US 6,728,931 B2
(45) Date of Patent: Apr. 27, 2004

(54) TIME DATA COMPRESSION TECHNIQUE FOR HIGH SPEED INTEGRATED CIRCUIT MEMORY DEVICES

(75) Inventors: Michael C. Parris, Colorado Springs, CO (US); Oscar Frederick Jones, Jr., Colorado Springs, CO (US)

(73) Assignee: ProMOS Technologies, Inc., Hsinchu (TW)

( * ) Notice: Subject to any disclaimer, the term of this patent is extended or adjusted under 35 U.S.C. 154(b) by 572 days.

(21) Appl. No.: 09/815,147

(22) Filed: Mar. 22, 2001

(65) Prior Publication Data

US 2002/0178413 A1 Nov. 28, 2002

(51) Int. Cl.[7] .................... G11B 27/00; H03M 7/00
(52) U.S. Cl. ........................ 714/814; 341/61
(58) Field of Search ................. 714/814, 815, 714/819, 811, 812, 700, 55; 713/401, 503; 341/61

(56) References Cited

U.S. PATENT DOCUMENTS 5,502,752 A  3/1996 Averbuch et al. ........... 375/377
6,195,024 B1  2/2001 Fallon ......................... 341/51
6,366,588 B1  4/2002 Gans et al. ................. 370/468
6,366,614 B1  4/2002 Pian et al. ............. 375/240.02

*Primary Examiner*—Christine T. Tu
(74) *Attorney, Agent, or Firm*—William J. Kubida; Hogan & Hartson LLP

(57) ABSTRACT

A time data compression technique which allows high speed integrated circuit ("IC") memory devices to be tested at full speed with test equipment which is capable of operating at only at relatively slower speeds than that of the memory devices without increasing test time or decreasing production throughput. Through the use of the technique disclosed herein, data is initially sorted in time and them compared for a predetermined number of logic level "1s" or "0s" to be effectively compressed in time. This time compression allows high rate data streams to be tested at effectively slower rates. The technique of the present invention can be utilized to effectively reduce the data rate by one half, one quarter or to any sub-multiple of the normal memory frequency without increasing time in test. In a particular embodiment, the present invention may be functional to convert double data rate ("DDR") data to single data rate ("SDR") to allow DDR memory devices to be more easily and effectively tested.

56 Claims, 8 Drawing Sheets

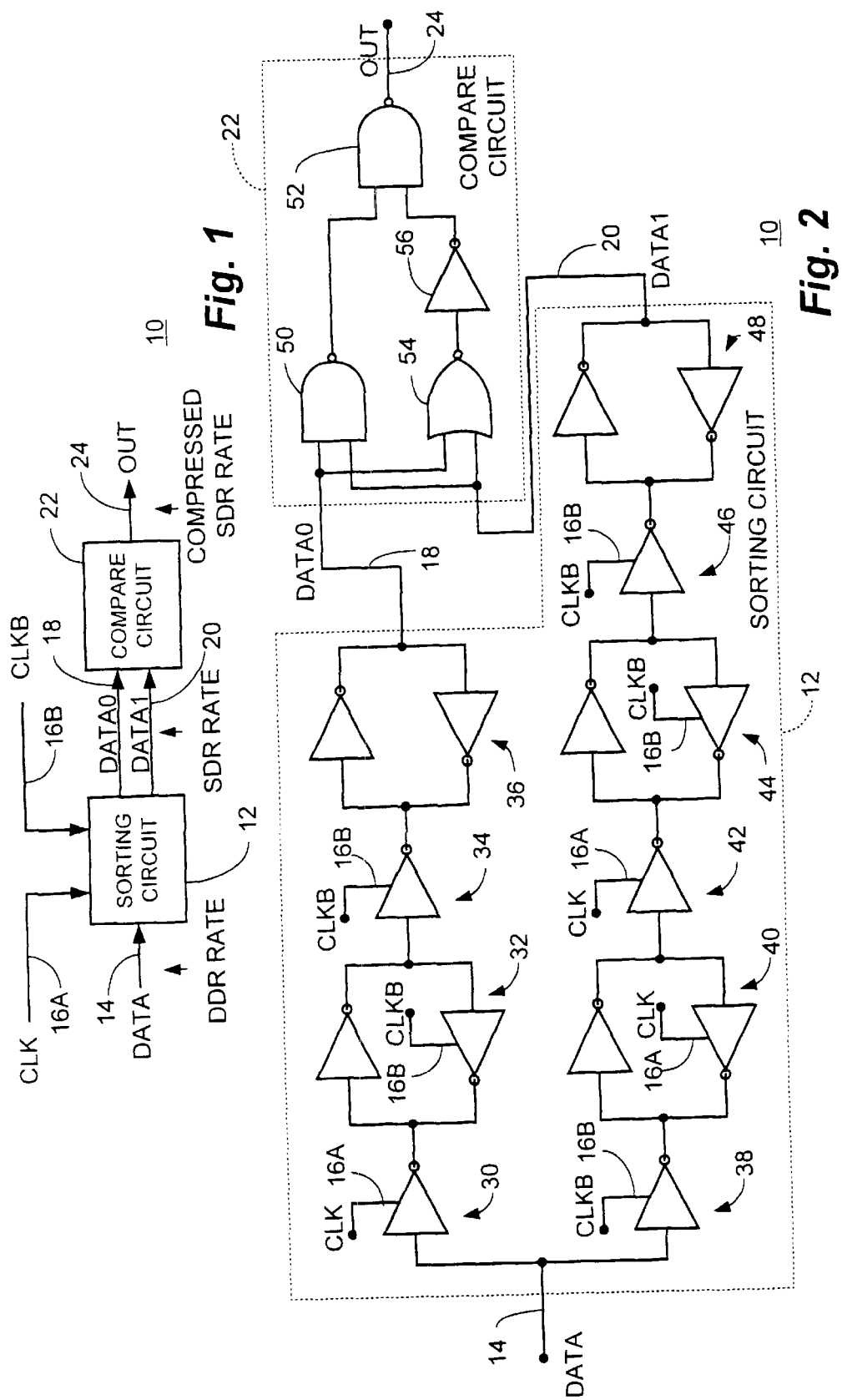

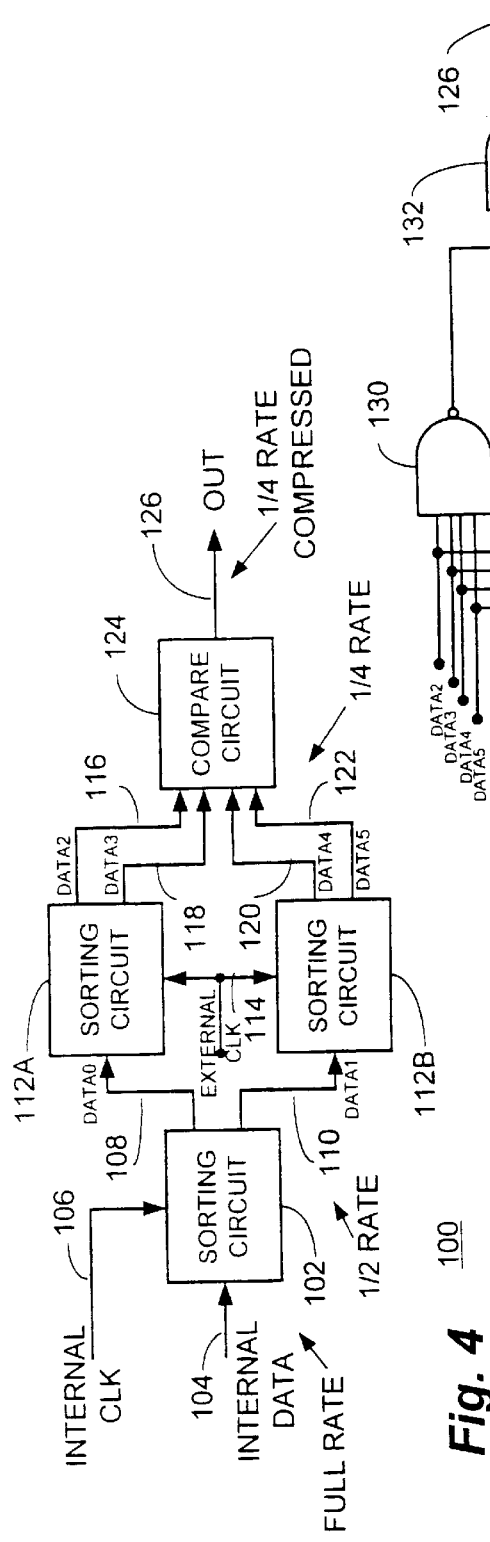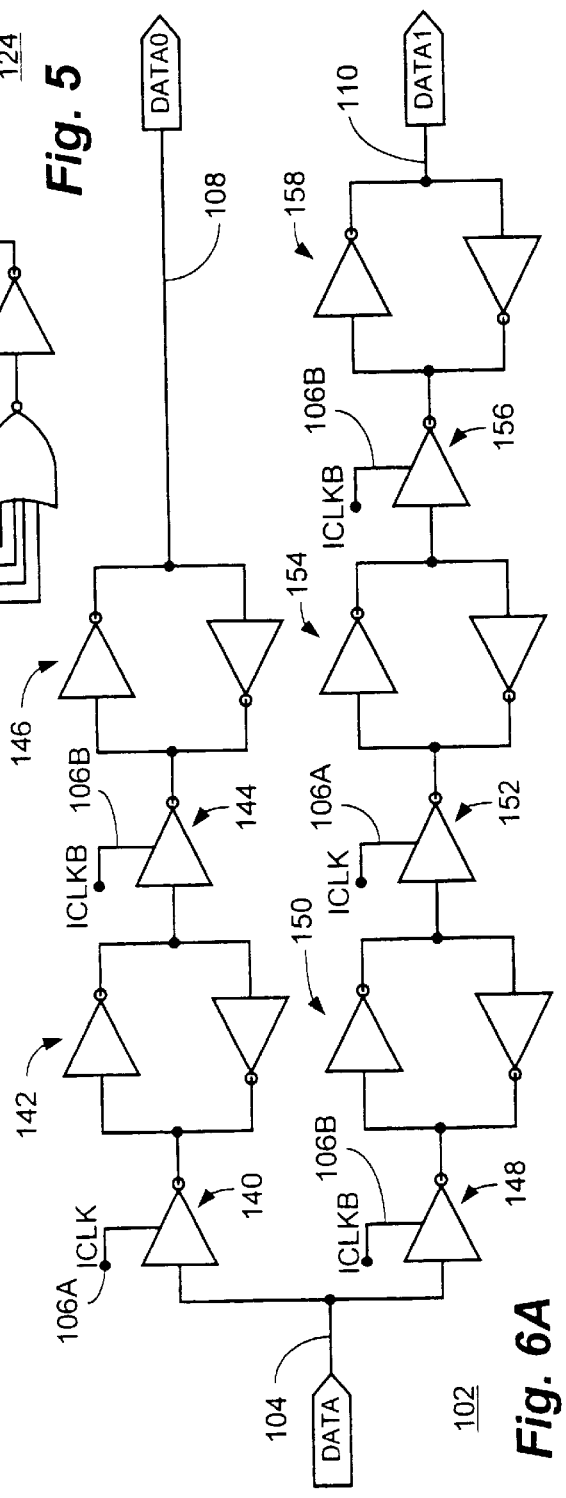

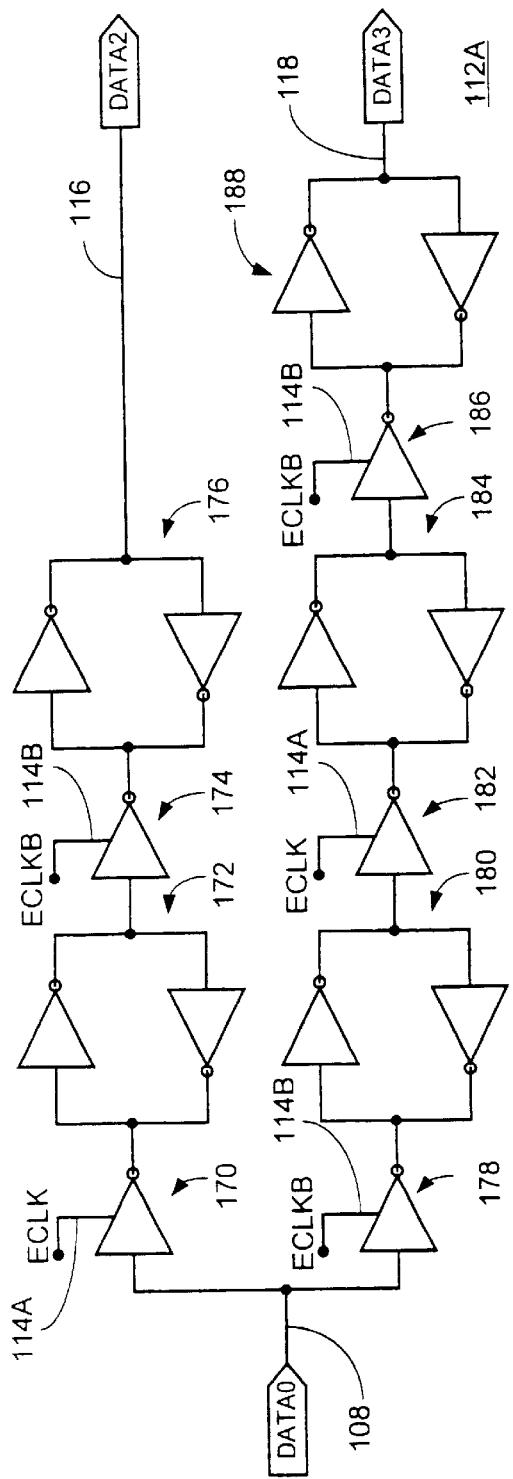

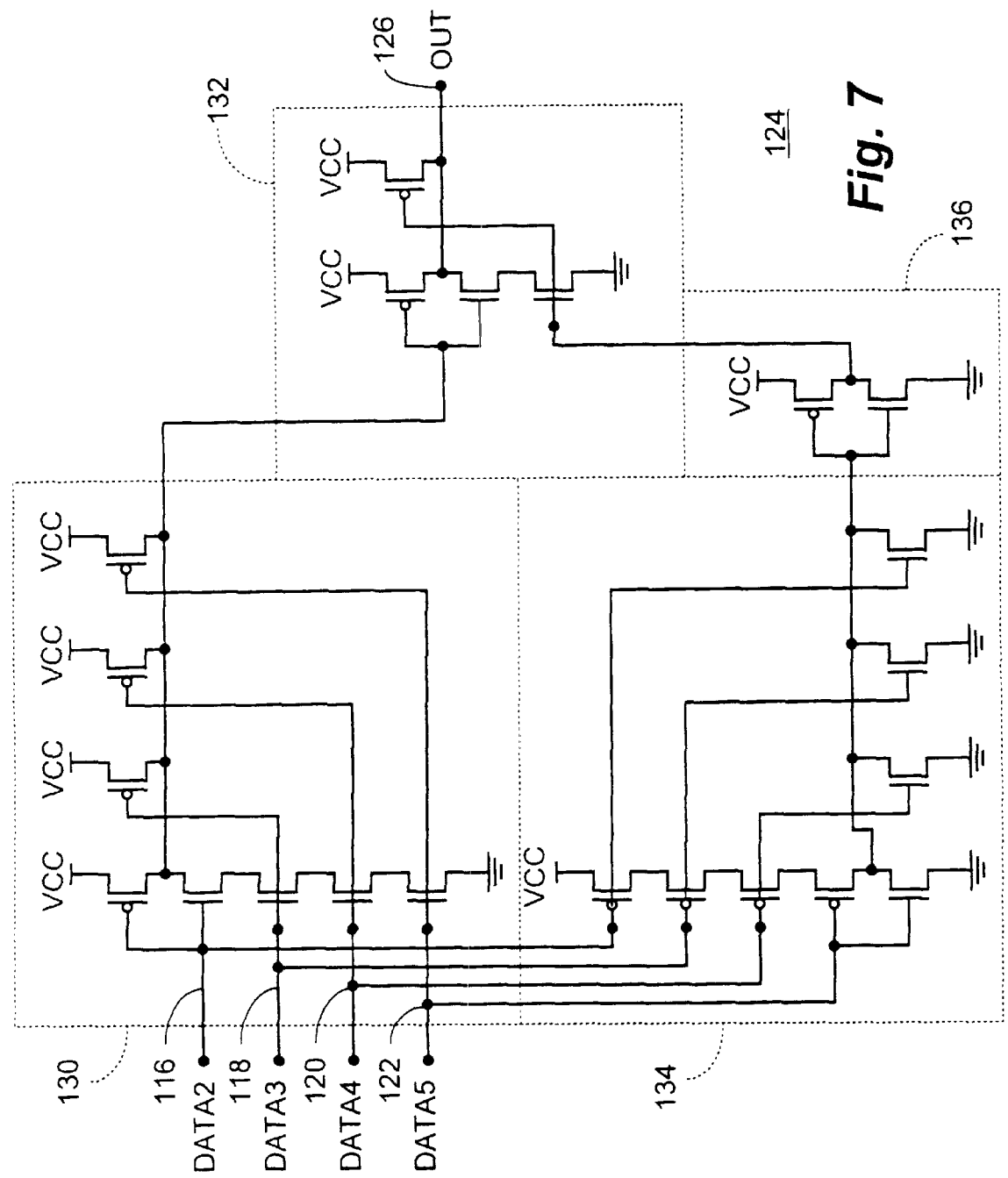

TIME DATA COMPRESSION TECHNIQUE FOR HIGH SPEED INTEGRATED CIRCUIT MEMORY DEVICES

BACKGROUND OF THE INVENTION

The present invention relates, in general, to the field of testing of high speed memory devices and circuits. As IC technologies advance, the data rates for memory circuits and devices are increasing rapidly. Unfortunately, the speed of equipment designed to test these memories has not kept pace and tester limitations (or those of test environments such as wafer probe testing) restrict the capabilities currently available to the industry. In an attempt to deal with these limitations, current approaches have had to resort to multiple pass testing which serves to increase device test time. Alternatively, testing has had to be limited to relatively slow clock rate testing of high performance memories at a fraction of their intended operational speeds.

SUMMARY OF THE INVENTION

The present invention advantageously provides a time data compression technique which allows high speed memory devices and systems to be tested at full speed utilizing existing, slower speed test equipment. In operation, the memories may be "exercised" at their full intended data rate using a relatively slow tester or test environment without increasing test time or decreasing production throughput. The technique of the present invention can be utilized to effectively reduce the data rate by one half, one quarter or to any sub-multiple of the normal memory frequency without increasing time in test. In a particular embodiment, the present invention may be functional to convert double data rate ("DDR") data to single data rate ("SDR") to allow DDR memory devices to be more easily and effectively tested.

Through the use of the technique disclosed herein, data is initially sorted in time and then compared for a predetermined number of logic level "1s" or "0s" to be effectively compressed in time. This time compression allows high rate data streams to be tested at effectively slower rates. In particular representative embodiments of the present invention described herein, 2× or 4× data time compressions may be readily implemented although even higher compression factors may also be provided utilizing the techniques disclosed.

Particularly disclosed herein is a time data compression circuit comprising a sorting circuit for receiving an input data rate signal and providing corresponding first and second lower data rate signals at first and second outputs thereof. A compare circuit is coupled to the first and second outputs of the sorting circuit to produce a first output signal when the first and second lower data rate signals are at a same logic level and a second output signal when the first and second lower data rate signals are at an opposite logic level.

Further disclosed herein is a time data compression circuit comprising a first sorting circuit for receiving an input data rate signal and providing corresponding first and second lower data rate signals at first and second outputs thereof. A second sorting circuit is coupled to the first output of the first sorting circuit for providing third and fourth relatively lower data rate signals in response to the first lower data rate signal and a third sorting circuit is coupled to the second output of the first sorting circuit for providing fifth and sixth relatively lower data rate signals in response to the second lower data rate signal. A compare circuit is coupled to receive the third, fourth, fifth and sixth relatively lower data rate signals from the second and third sorting circuits, to produce a first output signal when the third, fourth, fifth and sixth relatively lower data rate signals are at a same logic level and a second output signal when the third, fourth, fifth and sixth relatively lower data rate signals are not all at said same logic level.

Also disclosed herein is a method for time data compression comprising the steps of: receiving an input data rate signal, transforming the input data rate signal to first and second lower data rate signals, comparing the first and second lower data rate signals, outputting a first output signal when the first and second lower data rate signals are at a same logic level and outputting a second output signal when the first and second lower data rate signals are at an opposite logic level.

Still further disclosed herein is a method for time data compression comprising the steps of: receiving an input data rate signal, firstly transforming the input data rate signal to first and second lower data rate signals, secondly transforming the first and second lower data rate signals to third, fourth, fifth and sixth relatively lower data rate signals, comparing the third, fourth fifth and sixth relatively lower data rate signals, outputting a first output signal when the third, fourth fifth and sixth relatively lower data rate signals are at a same logic level and outputting a second output signal when the third, fourth fifth and sixth relatively lower data rate signals are not all at the same logic level.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1 is a simplified functional block diagram of a circuit in accordance with an embodiment of the present invention wherein double data rate ("DDR") data input to the circuit is output as compressed single data rate ("SDR") data;

FIG. 2 is a more detailed illustration of a possible implementation of the sorting and compare circuits of FIG. 1 showing, in the former instance, a number of alternating inverting amplifiers and clocked latch circuits for providing DATA0 and DATA1 outputs in response to a DDR data input and, in the latter instance, the logic for providing compressed SDR data output in response to the DATA0 and DATA1 signals;

FIG. 4 is a simplified function block diagram of a further circuit in accordance with another embodiment of the present invention wherein high speed DDR data input to the circuit is output as compressed one quarter data rate data;

FIG. 5 is a more detailed illustration of the compare circuit of FIG. 4 illustrating the input of one quarter rate data on data lines DATA2 through DATA5 inclusive to produce compressed one quarter rate data output;

FIGS. 6A through 6C inclusive are more detailed illustrations of the various sorting circuits of FIG. 4 for receiving internal data at a full data rate (as input to a first of the sorting circuits clocked by complementary internal clocking signals) which then provides half rate data on data lines DATA0 and DATA1 to the second and third sorting circuits as clocked by complementary external clocking signals;

FIG. 7 is a detailed schematic illustration of a possible implementation of the compare circuit of FIG. 4 implemented in CMOS technology;

DESCRIPTION OF A REPRESENTATIVE EMBODIMENT

Figure 3:
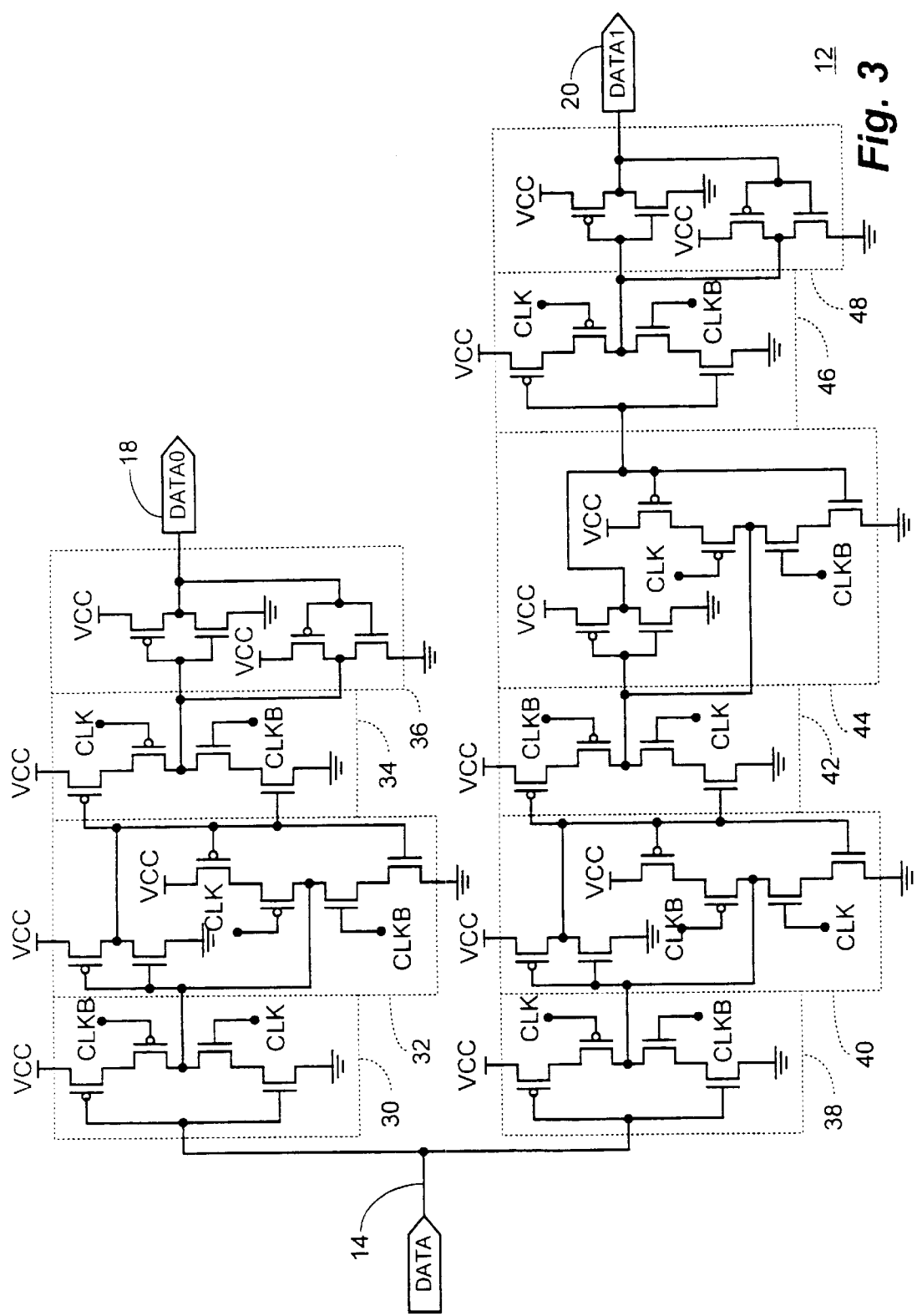
FIG. 3 is a detailed schematic illustration of a possible implementation of the sorting circuit of the preceding figures implemented in complementary metal oxide semiconductor ("CMOS") technology.

The technique of the present invention is operative to advantageously to effectively compress high frequency data in time such that one bit of data being read from a memory device or system represents several bits that have been passed through a compare circuit to yield either "pass" or "fail" information. One such use of the present invention is to allow a relatively low speed tester or test environment (e.g. a wafer probe) to test and verify a high speed memory circuit. In a particular embodiment disclosed, the compare function may be implemented as an exclusive NOT OR ("XNOR") operation in accordance with the following truth Table 1:

TABLE 1

| A | B | A XNOR B |
|---|---|----------|
| 0 | 0 | 1 |
| 0 | 1 | 0 |
| 1 | 0 | 0 |
| 1 | 1 | 1 |

If both the A and B inputs are the same, a logic level "1" (i.e. a "pass") is output. On the other hand, if the A an B inputs are different, a logic level "0" (i.e. a "fail" is provided. This is the case because it is expected that both inputs would be the same since the rising edge and falling edge data were written to the same value (half rate writes).

With reference now to FIG. 1, a simplified functional block diagram of a circuit 10 in accordance with an embodiment of the present invention is shown for performing the previously described function. The circuit 10 is operational such that double data rate ("DDR") data input to the circuit 10 is subsequently output as compressed single data rate ("SDR") data.

The circuit 10 comprises a sorting circuit 12 which is coupled to receive an input data signal (e.g. a DDR rate data signal) on line 14. The sorting circuit is clocked by means of complementary clock ("CLK") and clock bar ("CLKB") signals on lines 16A and 16B respectively to provide SDR rate data signals on data lines 18 ("DATA0") and 20 ("DATA1"). The data lines 18 and 20 are input to a compare circuit 22 to provide a compressed SDR rate data signal on OUT line 24.

With reference additionally now to FIG. 2, a more detailed illustration of a possible implementation of the sorting and compare circuits 12, 22 of the circuit 10 of FIG. 1 is shown. With respect to the sorting circuit 12, a number of alternating inverting amplifiers and clocked latch circuits are utilized for providing DATA0 and DATA1 outputs on data lines 18 and 20 in response to a DDR data input on line 14. The compare circuit 22, in turn, provides a compressed SDR data output on line 24 in response to the DATA0 and DATA1 signals.

The particular embodiment of the sorting circuit 12 comprises a first clocked inverter 30 coupled to the DATA line 14. The inverter 30 is clocked by the CLK signal on line 16A and its output is supplied to the input of a latch circuit 32 comprising a pair of cross coupled inverters, one of which is clocked by the CLKB signal on line 16B. As shown, the output of the latch circuit 32 is coupled to the input of another inverter 34 which is clocked by the CLKB signal on line 16B. Output of the inverter 34 is coupled to the input of an additional latch circuit 36 which has its output coupled to supply the DATA0 signal on line 18.

In like manner, the sorting circuit 12 further comprises another clocked inverter 38 coupled to the DATA line 14. The inverter 38 is clocked by the CLKB signal on line 16B and its output is supplied to the input of a latch circuit 40 comprising a pair of cross coupled inverters, one of which is clocked by the CLK signal on line 16A. As shown, the output of the latch circuit 40 is coupled to the input of another inverter 42 which is clocked by the CLK signal on line 16A. Output of the inverter 42 is coupled to the input of an additional latch circuit 44 also comprising a pair of cross coupled inverters, one of which is clocked by the CLKB signal on line 16B. Another clocked inverter 46 clocked by the CLKB signal on line 16B couples the output of the latch circuit 44 to the input of a final latch circuit 48 which, in turn, has its output coupled to supply the DATA1 signal on line 20.

With respect to the compare circuit 22, the particular implementation shown comprises a first two input NAND gate 50 which is coupled to receive the DATA0 and DATA1 signals on lines 18 and 20. Output of the NAND gate 50 is supplied as one input to an additional two input NAND gate 52 which has its output coupled to provide a compressed SDR rate data output signal on OUT line 24. A two input NOR gate 54 is coupled in parallel with the inputs to the NAND gate 50 and has its output coupled through an inverter 56 to the remaining input of the NAND gate 52.

In operation, it can be seen that a logic level "1" signal on DATA0 line 18 in conjunction with a logic level "1" signal on DATA1 line 20 will result in a logic level "1" on OUT line 24. Similarly, a logic level "0" signal on DATA1 line 20 in conjunction with a logic level "0" signal on DATA0 line 18 will also result in a logic level "1" on OUT line 24. Any other combination of a logic level "1" or "0" on one of the DATA0 or DATA1 lines 18, 20 in conjunction with an opposite logic state on the other will provide a logic level "0" on OUT line 24 in accordance with the foregoing truth Table 1.

With reference additionally now to FIG. 3, a detailed schematic illustration of a possible implementation of the sorting circuit 12 of the preceding figures is shown, for example, implemented utilizing CMOS technology. In this depiction, an actual gate level implementation of the sorting circuit 12 shows how the clocked inverters may be designed and used in conjunction with standard CMOS inverters configurations. Those elements previously described and shown with respect to the preceding figures are like numbered and the foregoing description thereof shall suffice herefor.

As illustrated and described with respect to FIGS. 1 through 3 inclusive, in a particular implementation of the technique of the present invention, the circuit 10 can be used to effectively convert DDR rate to date to SDR rate data or to convert SDR rate data to half rate data. It should be noted that the principles of the present invention can easily be extended to convert DDR rate data to half rate SDR data or SDR rate data to one fourth rate SDR data and so on.

With reference additionally now to FIG. 4, a simplified function block diagram of a further circuit 100 in accordance with another embodiment of the present invention is shown wherein high speed DDR data input to the circuit 100 is subsequently output as compressed one quarter data rate data. The circuit 100 comprises a first sorting circuit 102 which is coupled to receive, for example, internal full data rate data on input line 104. The sorting circuit 102 may be coupled to receive one or more internal clock signals (e.g. "ICLK" and complementary "ICLKB" signals) on line 106. Output of the sorting circuit 102 is provided (as with respect to the sorting circuit 12 of FIGS. 1 through 3) as a half rate DATA0 on line 108 and DATA1 signal on line 110.

The DATA0 signal on line 108 is furnished as an input to another sorting circuit 112A which, in turn, provides quarter rate DATA2 and DATA3 signals on lines 116 and 118 respectively. In like manner, the DATA1 signal on line 110 is furnished as an input to yet another sorting circuit 112B which, in turn, provides quarter rate DATA4 and DATA5 signals on lines 120 and 122 respectively. Both of the sorting circuits 112A and 112B are clocked by one or more external clock signals (e.g. "ECLK" and complementary "ECLKB" signals) on line 114. Lines 116, 118, 120 and 122 are provided as inputs to a compare circuit 124 to provide a one quarter rate compressed output signal on OUT line 126.

With reference additionally now to FIG. 5, a more detailed illustration of the compare circuit 124 depicted in FIG. 4 is shown illustrating the input of one quarter rate data on data lines DATA2 through DATA5 inclusive to produce compressed one quarter rate data output on line 126. This particular implementation of a compare circuit 124 comprises a first four input NAND gate 130 which is coupled to receive the DATA2 through DATA5 signals on lines 116, 118, 120 and 122 respectively. Output of the NAND gate 130 is supplied as one input to an additional two input NAND gate 132 which has its output coupled to provide a compressed SDR rate data output signal on OUT line 126. A four input NOR gate 134 is coupled in parallel with the inputs to the NAND gate 50 and has its output coupled through an inverter 136 to the remaining input of the NAND gate 132.

With reference additionally now to FIGS. 6A through 6C inclusive, more detailed illustrations of the sorting circuits 102, 112A and 112B respectively of FIG. 4 are shown for receiving internal data at a full data rate in sorting circuit 102, which then provides half rate data on data lines DATA0 and DATA1 to the second and third sorting circuits 112A and 112.

As shown, the sorting circuit 102 comprises a first clocked inverter 140 coupled to the DATA line 104. The inverter 140 is clocked by the ICLK signal on line 106A and its output is supplied to the input of a latch circuit 142 comprising a pair of cross coupled inverters. As shown, the output of the latch circuit 142 is coupled to the input of another inverter 144 which is clocked by the ICLKB signal on line 106B. Output of the inverter 144 is coupled to the input of an additional latch circuit 146 which has its output coupled to supply the DATA0 signal on line 108.

In like manner, the sorting circuit 102 further comprises another clocked inverter 148 coupled to the DATA line 104. The inverter 148 is clocked by the ICLKB signal on line 106B and its output is supplied to the input of a latch circuit 150 comprising a pair of cross coupled inverters. As shown, the output of the latch circuit 150 is coupled to the input of another inverter 152 which is clocked by the ICLK signal on line 106A. Output of the inverter 152 is coupled to the input of an additional latch circuit 154 also comprising a pair of cross coupled inverters. Another clocked inverter 156 clocked by the ICLKB signal on line 106B couples the output of the latch circuit 154 to the input of a final latch circuit 158 which, in turn, has its output coupled to supply the DATA1 signal on line 110.

Similarly, the sorting circuit 112A comprises a first clocked inverter 170 coupled to the DATA0 line 108. The inverter 170 is clocked by the ECLK signal on line 114A and its output is supplied to the input of a latch circuit 172 comprising a pair of cross coupled inverters. As shown, the output of the latch circuit 172 is coupled to the input of another inverter 174 which is clocked by the ECLKB signal on line 114B. Output of the inverter 174 is coupled to the input of an additional latch circuit 176 which has its output coupled to supply the DATA2 signal on line 116.

The sorting circuit 112A further comprises another clocked inverter 178 coupled to the DATA0 line 108. The inverter 178 is clocked by the ECLKB signal on line 114B and its output is supplied to the input of a latch circuit 180 comprising a pair of cross coupled inverters. As shown, the output of the latch circuit 180 is coupled to the input of another inverter 182 which is clocked by the ECLK signal on line 114A. Output of the inverter 182 is coupled to the input of an additional latch circuit 184 also comprising a pair of cross coupled inverters. Another clocked inverter 186 clocked by the ECLKB signal on line 114B couples the output of the latch circuit 184 to the input of a final latch circuit 188 which, in turn, has its output coupled to supply the DATA3 signal on line 118.

Correspondingly, the sorting circuit 112B comprises a first clocked inverter 190 coupled to the DATA1 line 110. The inverter 190 is clocked by the ECLK signal on line 114A and its output is supplied to the input of a latch circuit 192 comprising a pair of cross coupled inverters. As shown, the output of the latch circuit 192 is coupled to the input of another inverter 194 which is clocked by the ECLKB signal on line 114B. Output of the inverter 194 is coupled to the input of an additional latch circuit 196 which has its output coupled to supply the DATA4 signal on line 120.

The sorting circuit 112B further comprises another clocked inverter 198 coupled to the DATA1 line 110. The inverter 198 is clocked by the ECLKB signal on line 114B and its output is supplied to the input of a latch circuit 200 comprising a pair of cross coupled inverters. As shown, the output of the latch circuit 200 is coupled to the input of another inverter 202 which is clocked by the ECLK signal on line 114A. Output of the inverter 202 is coupled to the input of an additional latch circuit 204 also comprising a pair of cross coupled inverters. Another clocked inverter 206 clocked by the ECLKB signal on line 114B couples the output of the latch circuit 204 to the input of a final latch circuit 208 which, in turn, has its output coupled to supply the DATA5 signal on line 122.

With reference additionally now to FIG. 7, a detailed schematic illustration of a possible implementation of the compare circuit 124 of FIG. 4 is shown as implemented, for example, utilizing CMOS technology. In this figure, corresponding elements to those previously described and shown with respect to FIG. 4 are like numbered and the foregoing description thereof shall suffice herefor. As shown, the four input NAND gate 130, the two input NAND gate 132, the four input NOR gate 134 and the inverter 136 comprise conventional CMOS logic elements.

Figure 8:
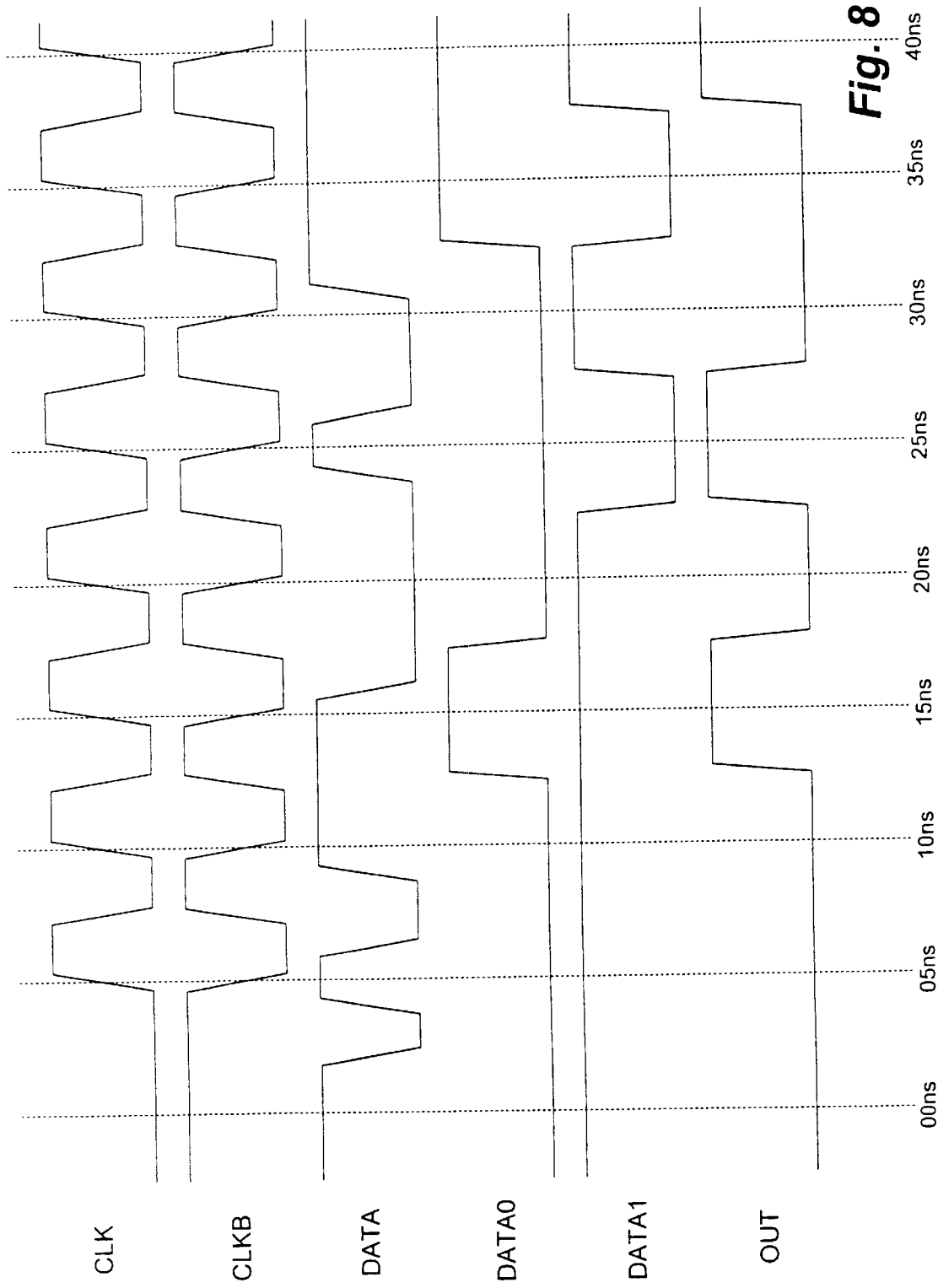
FIG. 8 is a representative timing diagram illustrative of the interrelationship among the complementary clock signals ("CLK" and "CLKB"), DDR data input ("DATA"), SDR rate data lines ("DATA0" and "DATA1") and compressed SDR rate data output ("OUT") for the embodiment of the present invention illustrated in FIGS. 1 through 3.

With reference additionally now to FIG. 8, a representative timing diagram is presented illustrative of the interrelationship among the complementary clock signals ("CLK" and "CLKB"), DDR data input ("DATA"), SDR rate data lines ("DATA0" and "DATA1") and compressed SDR rate data output ("OUT") for the embodiment of the present invention previously illustrated and described with respect to circuit 10 of FIGS. 1 through 3. As previously described, the circuit 10 receives a DDR rate DATA signal on line 14 and the sorting circuit 12, in turn, produces SDR rate DATA0 and DATA1 signals related thereto. The compare circuit 22 receives the DATA0 and DATA1 signals to provide a compressed SDR rate signal on OUT line 24.

As also previously described, the circuit 10 is operational such that a logic level "1" DATA0 signal in conjunction with a logic level "1" DATA1 signal will result in a logic level "1" on OUT line 24. This condition is illustrated at the 15 ns point on the timing diagram. Similarly, a logic level "0" DATA1 signal in conjunction with a logic level "0" DATA0 signal will also result in a logic level "1" on OUT line 24. This condition is illustrated at the 25 ns point. Any other combination of a logic level "1" or "0" on one of the DATA0 or DATA1 lines in conjunction with an opposite logic state on the other will provide a logic level "0" on OUT line 24 in accordance with truth Table 1.

Figure 9:
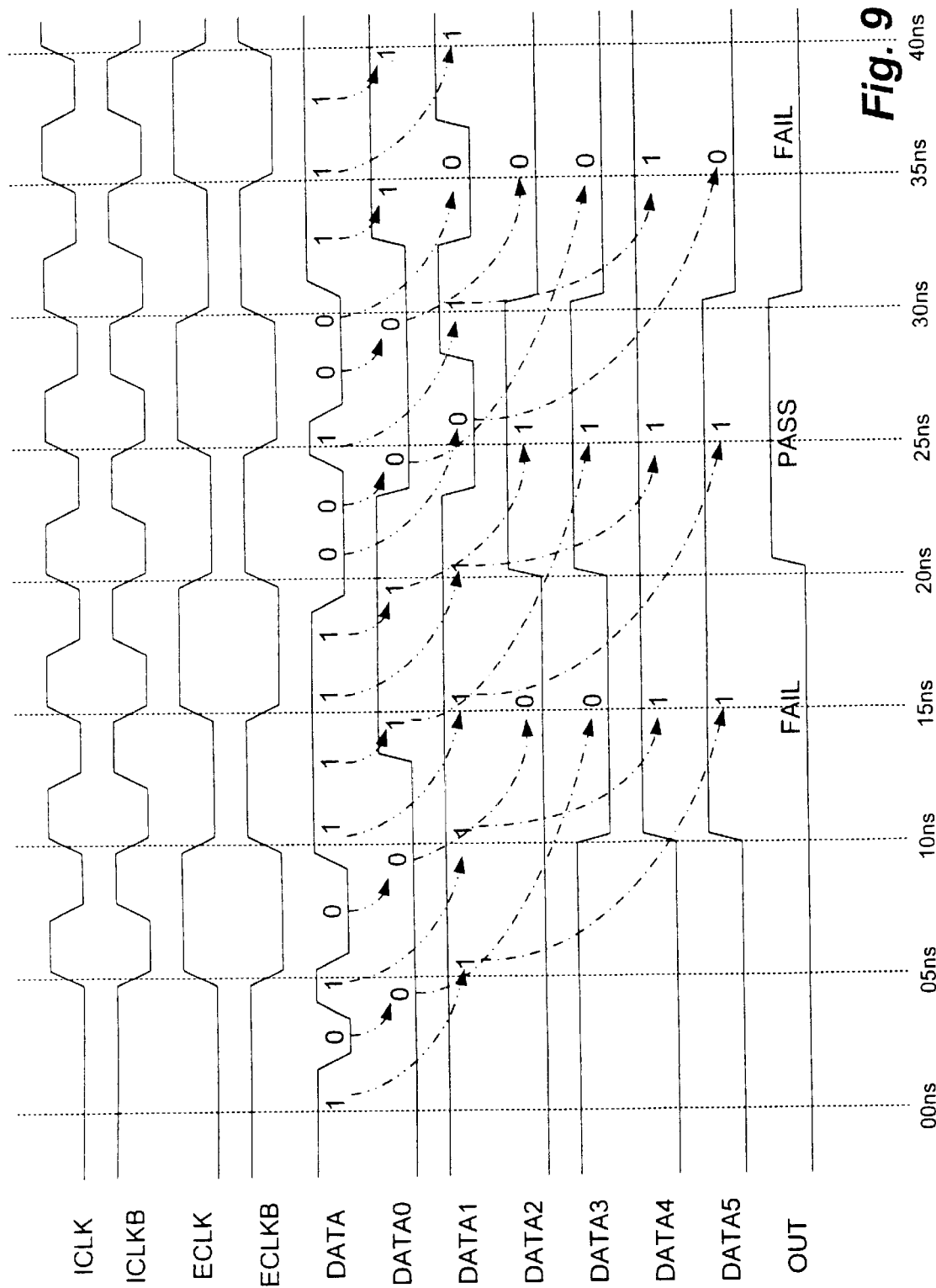
FIG. 9 is a representative timing diagram illustrative of the interrelationship among the complementary internal ("ICLK" and "ICLKB") and external ("ECLK" and "ECLKB") clock signals, full rate input data ("DATA"), half rate data lines ("DATA0" and "DATA1"), one quarter rate data lines ("DATA2" through "DATA5" inclusive) and one quarter rate compressed data output ("OUT") for the embodiment of the present invention illustrated in FIGS. 4 through 7 wherein the DATA signal provides four consecutive states having the same logic level in succession (i.e. four logic level "1s")

With reference additionally now to FIG. 9, a representative timing diagram is also presented illustrative of the interrelationship among the complementary internal ("ICLK" and "ICLKB") and external ("ECLK" and "ECLKB") clock signals, full rate input data ("DATA"), half rate data lines ("DATA0" and "DATA1"), one quarter rate data lines ("DATA2" through "DATA5" inclusive) and one quarter rate compressed data output ("OUT") for the embodiment of the present invention illustrated and described with respect to FIGS. 4 through 7.

As shown, the DATA signal provides four consecutive states having the same logic level in succession (i.e. four logic level "1s") beginning about the 10 ns point. This ultimately results in the concurrence of four substantially simultaneous logic level "1s" on the DATA2, DATA3, DATA4 and DATA5 lines shown beginning about the 20 ns point. This then causes the OUT signal on line 126 to transition to a logic level "1" indicating a "pass". Any combination of signal levels on the DATA2, DATA3, DATA4 and DATA5 lines other than all "0s" or "1s" will result in a logic level "0" on OUT signal line 126, or a "fail" indication.

Figure 10:
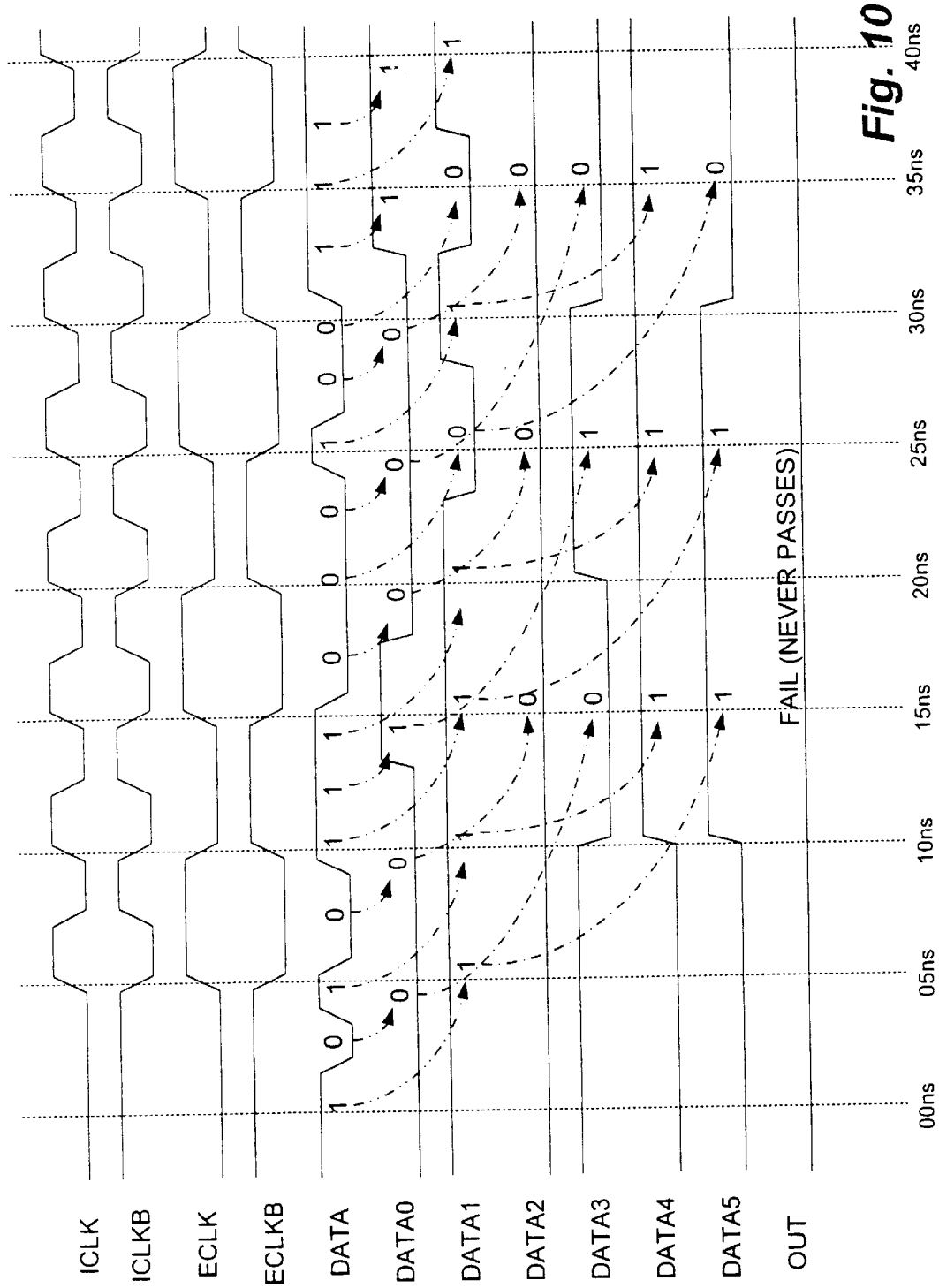
FIG. 10 is an analogous representative timing diagram illustrative of the signals illustrated in the preceding figure in which the DATA signal does not provide four consecutive states having the same logic level in succession.

With reference additionally now to FIG. 10, an analogous representative timing diagram to that shown in FIG. 9 is depicted illustrative of the signals illustrated and described with respect thereto and in which the input DATA signal does not provide four consecutive states having the same logic level in succession. (As shown, and distinguishing this timing diagram from the preceding figure, there are no more than three consecutive logic level "0s" or "1s".) In turn, this then means that there is no concurrence of four substantially simultaneous logic level "0" or "1s" on the DATA2, DATA3, DATA4 and DATA5 lines. Since, in the example shown, the DATA2 line remains at a logic level "0" while the remaining lines DATA3, DATA4 and DATA5 are never all in a logic "0" state at the same time, the signal on OUT line 126 remains at a logic level "0" indicating a "fail" condition.

While there have been described above the principles of the present invention in conjunction with specific circuit designs and applications, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A time data compression circuit comprising:
    a sorting circuit for receiving an input data rate signal and providing corresponding first and second lower data rate signals at first and second outputs thereof;
    a compare circuit coupled to said first and second outputs of said sorting circuit, said compare circuit producing a first output signal when said first and second lower data rate signals are at a same logic level and a second output signal when said first and second lower data rate signals are at an opposite logic level.

2. The circuit of claim 1 wherein said sorting circuit comprises first and second series coupled latch circuits coupling said input data rate signal to said first and second outputs respectively.

3. The circuit of claim 2 wherein at least a portion of said first and second series coupled latch circuits are clocked with at least one clocking signal.

4. The circuit of claim 3 wherein said at least one clocking signal comprises a pair of complementary clocking signals.

5. The circuit of claim 2 wherein each of said first and second series coupled latch circuits comprise at least one inverter.

6. The circuit of claim 5 wherein at least a portion of said at least one inverter in said first and second latch circuits are clocked with at least one clocking signal.

7. The circuit of claim 6 wherein said at least one clocking signal comprises a pair of complementary clocking signals.

8. The circuit of claim 1 wherein said compare circuit is operative to provide said first and second output signals in response to an Exclusive NOR operation on said first and second lower data rate signals.

9. The circuit of claim 1 wherein said compare circuit comprises:

a NAND gate coupled to receive said first and second lower data rate signals.

10. The circuit of claim 9 further comprising:
a NOR gate coupled to receive said first and second lower data rate signals.

11. The circuit of claim 10 further comprising:
an additional NAND gate coupled to receive an output of said NAND and NOR gates, said additional NAND gate for providing said first and second output signals.

12. The circuit of claim 11 further comprising:
an inverter interposed between said output of said NOR gate and said additional NAND gate.

13. The circuit of claim 1 wherein said input data rate signal is a DDR data signal.

14. The circuit of claim 1 wherein said first and second lower data rate signals are SDR data signals.

15. The circuit of claim 1 wherein said first and second output signals are compressed SDR data signals.

16. A time data compression circuit comprising:
a first sorting circuit for receiving an input data rate signal and providing corresponding first and second lower data rate signals at first and second outputs thereof;
a second sorting circuit coupled to said first output of said first sorting circuit for providing third and fourth relatively lower data rate signals in response to said first lower data rate signal;
a third sorting circuit coupled to said second output of said first sorting circuit for providing fifth and sixth relatively lower data rate signals in response to said second lower data rate signal; and
a compare circuit coupled to receive said third, fourth, fifth and sixth relatively lower data rate signals from said second and third sorting circuits, said compare circuit producing a first output signal when said third, fourth, fifth and sixth relatively lower data rate signals are at a same logic level and a second output signal when said third, fourth, fifth and sixth relatively lower data rate signals are not all at said same logic level.

17. The circuit of claim 16 wherein said first sorting circuit comprises first and second series coupled latch circuits coupling said input data rate signal to said first and second outputs respectively.

18. The circuit of claim 17 wherein at least a portion of said first and second series coupled latch circuits are clocked with at least one first clocking signal.

19. The circuit of claim 18 wherein said at least one first clocking signal comprises a pair of complementary first clocking signals.

20. The circuit of claim 17 wherein each of said first and second series coupled latch circuits comprise at least one inverter.

21. The circuit of claim 19 wherein at least a portion of said at least one inverter in said first and second latch circuits are clocked with at least one first clocking signal.

22. The circuit of claim 19 wherein said at least one first clocking signal comprises a pair of complementary first clocking signals.

23. The circuit of claim 16 wherein at least a portion of said second and third sorting circuits comprises first and second series coupled latch circuits.

24. The circuit of claim 23 wherein at least a portion of said first and second series coupled latch circuits are clocked with at least one second clocking signal.

25. The circuit of claim 24 wherein said at least one second clocking signal comprises a pair of complementary second clocking signals.

26. The circuit of claim 23 wherein each of said first and second series coupled latch circuits comprise at least one inverter.

27. The circuit of claim 26 wherein at least a portion of said at least one inverter in said first and second latch circuits are clocked with at least one second clocking signal.

28. The circuit of claim 27 wherein said at least one second clocking signal comprises a pair of complementary second clocking signals.

29. The circuit of claim 16 wherein said compare circuit is operative to provide said first and second output signals in response to an Exclusive NOR operation on said third, fourth, fifth and sixth relatively lower data rate signals.

30. The circuit of claim 16 wherein said compare circuit comprises:
a NAND gate coupled to receive said third, fourth, fifth and sixth relatively lower data rate signals.

31. The circuit of claim 30 further comprising:
a NOR gate coupled to receive said third, fourth, fifth and sixth relatively lower data rate signals.

32. The circuit of claim 31 further comprising:
an additional NAND gate coupled to receive an output of said NAND and NOR gates, said additional NAND gate for providing said first and second output signals.

33. The circuit of claim 32 further comprising:
an inverter interposed between said output of said NOR gate and said additional NAND gate.

34. The circuit of claim 16 wherein said input data rate signal is a full data rate signal.

35. The circuit of claim 16 wherein said first and second lower data rate signals are half data rate signals.

36. The circuit of claim 16 wherein said third, fourth, fifth and sixth relatively lower data rate signals are quarter data rate signals.

37. The circuit of claim 16 wherein said first and second output signals are compressed quarter rate data signals.

38. A method for time data compression comprising:
receiving an input data rate signal;
transforming said input data rate signal to first and second lower data rate signals;
comparing said first and second lower data rate signals;
outputting a first output signal when said first and second lower data rate signals are at a same logic level; and
outputting a second output signal when said first and second lower data rate signals are at an opposite logic level.

39. The method of claim 38 wherein said step of receiving an input data rate signal is carried out by means of a DDR rate data signal.

40. The method of claim 39 wherein said first and second lower data rate signals comprise SDR rate data signals.

41. The method of claim 40 wherein said first and second output signals comprise compressed SDR rate data signals.

42. The method of claim 38 wherein said step of transforming said input data rate signal is carried out by a sorting circuit.

43. The method of claim 38 wherein said step of comparing said first and second lower data rate signals is carried out by means of a compare circuit.

44. The method of claim 38 wherein said step of comparing is carried out by an Exclusive NOR operation.

45. The method of claim 38 wherein said step of transforming is carried out by:
selectively clocking said input data rate signal through first and second latch circuits to produce said first and second lower data rate signals.

46. A method for time data compression comprising:

receiving an input data rate signal;

firstly transforming said input data rate signal to first and second lower data rate signals;

secondly transforming said first and second lower data rate signals to third, fourth, fifth and sixth relatively lower data rate signals;

comparing said third, fourth fifth and sixth relatively lower data rate signals;

outputting a first output signal when said third, fourth fifth and sixth relatively lower data rate signals are at a same logic level; and outputting a second output signal when said third, fourth fifth and sixth relatively lower data rate signals are not all at said same logic level.

47. The method of claim 46 wherein said step of receiving an input data rate signal is carried out by means of a full rate data signal.

48. The method of claim 47 wherein said first and second lower data rate signals comprise half rate data signals.

49. The method of claim 48 wherein said third, fourth, fifth and sixth relatively lower data rate signals comprise quarter rate data signals.

50. The method of claim 49 wherein said first and second output signals comprise compressed quarter rate data signals.

51. The method of claim 46 wherein said step of firstly transforming said input data rate signal is carried out by a first sorting circuit.

52. The method of claim 51 wherein said step of secondly transforming said first and second lower data rate signals is carried out by second and third sorting circuits.

53. The method of claim 46 wherein said step of comparing said third, fourth fifth and sixth relatively lower data rate signals is carried out by means of a compare circuit.

54. The method of claim 46 wherein said step of comparing is carried out by an Exclusive NOR operation.

55. The method of claim 46 wherein said step of firstly transforming is carried out by:

selectively clocking said input data rate signal through first and second latch circuits to produce said first and second lower data rate signals.

56. The method of claim 46 wherein said step of secondly transforming is carried out by:

selectively clocking each of said first and second lower data rate signals through respective pairs of latch circuits to produce said third, fourth fifth and sixth relatively lower data rate signals.

* * * * *

UNITED STATES PATENT AND TRADEMARK OFFICE
CERTIFICATE OF CORRECTION

PATENT NO. : 6,728,931 B2
DATED : April 27, 2004
INVENTOR(S) : Michael C. Parris and Oscar Frederick Jones, Jr.

It is certified that error appears in the above-identified patent and that said Letters Patent is hereby corrected as shown below:

<u>Title page,</u>
Item [57], ABSTRACT,
Line 7, "them" should be -- then --

<u>Column 11,</u>
Lines 8, 10 and 13, after "fourth", insert -- , --

<u>Column 12,</u>
Lines 8 and 21, after "fourth", insert -- , --

Signed and Sealed this

Thirteenth Day of July, 2004

JON W. DUDAS
*Acting Director of the United States Patent and Trademark Office*